(12) United States Patent
Morimoto et al.

(10) Patent No.: US 7,199,652 B2
(45) Date of Patent: Apr. 3, 2007

(54) AMPLIFIER; AND TRANSMITTER AND COMMUNICATION DEVICE INCORPORATING THE SAME

(75) Inventors: Shigeru Morimoto, Ibaraki (JP); Hisashi Adachi, Mino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/988,499

(22) Filed: Nov. 16, 2004

(65) Prior Publication Data
US 2005/0110572 A1 May 26, 2005

(30) Foreign Application Priority Data
Nov. 21, 2003 (JP) .............................. 2003-392854

(51) Int. Cl.
*G06G 7/12* (2006.01)
*H03F 1/34* (2006.01)

(52) U.S. Cl. ........................................ 327/560; 330/294
(58) Field of Classification Search ................ 330/294; 327/110, 562
See application file for complete search history.

(56) References Cited

U.S. PATENT DOCUMENTS

| | | | |
|---|---|---|---|
| 4,845,441 A * | 7/1989 | Dick | 330/302 |
| 6,239,664 B1 * | 5/2001 | Northam | 42/16 |
| 6,256,482 B1 | 7/2001 | Raab | 455/108 |
| 6,285,257 B1 * | 9/2001 | Abe et al. | 330/282 |
| 6,300,827 B1 * | 10/2001 | King | 330/65 |
| 6,441,689 B1 * | 8/2002 | Joseph | 330/302 |
| 2003/0054792 A1 * | 3/2003 | Nam | 455/341 |
| 2005/0225397 A1 * | 10/2005 | Bhatia et al. | 330/311 |

OTHER PUBLICATIONS

Behzad Razavi, "RF Microelectronics", Prentice Hall PTR, Nov. 1, 1997, p. 169.

* cited by examiner

*Primary Examiner*—My-Trang Nu Ton
(74) *Attorney, Agent, or Firm*—Wenderoth, Lind & Ponack, L.L.P.

(57) ABSTRACT

The present invention provides an amplifier for amplifying a high-frequency signal and outputting an amplified signal. The amplifier includes: an amplification element which is a bipolar transistor or a field-effect transistor; and an inductor connected between a base and a collector or between a gate and a drain of the amplification element. The inductance of the inductor is chosen so that, within a predetermined frequency range, a parallel resonance occurs with a parasitic capacitor of the amplification element and an intrinsic capacitor of the amplification element, the intrinsic capacitor being a base-collector capacitance or a gate-drain capacitance.

18 Claims, 12 Drawing Sheets

F I G. 4
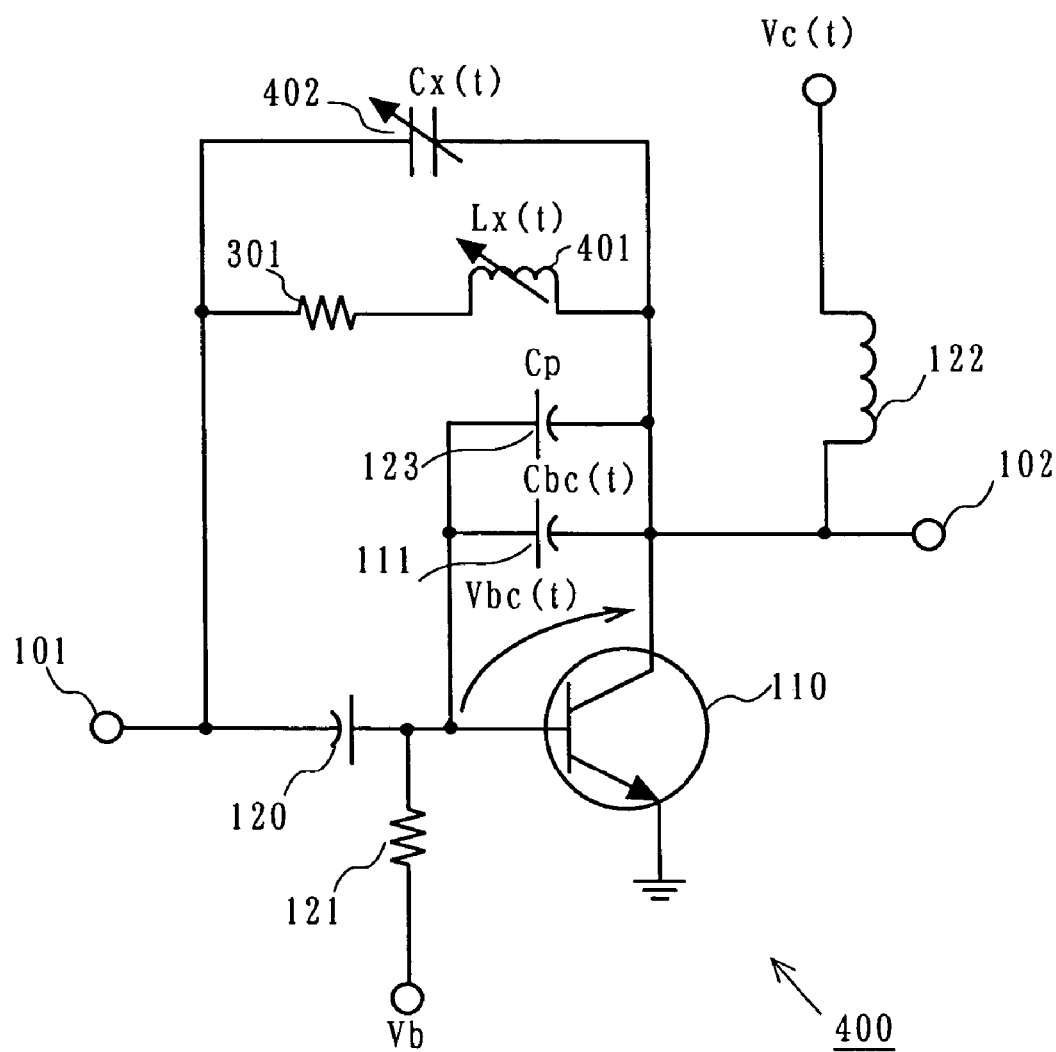

AMPLIFIER; AND TRANSMITTER AND COMMUNICATION DEVICE INCORPORATING THE SAME

BACKGROUND OF THE INVENTION

1. Field of the Invention

The present invention relates to an amplifier as well as a transmitter and a communication device incorporating the same. More particularly, the present invention relates to an amplifier which operates with a high frequency, as well as a transmitter and a communication device incorporating the same.

2. Description of the Background Art

A power amplifier to be used in a transmission block of a mobile phone or the like must be able to amplify a signal on the order of several W with a high gain.

FIG. 10 is a diagram illustrating an exemplary structure of a conventional amplifier 900 designed for amplifying a weak received signal (see, for example, Behzad Razavi, "RF Microelectronics", Prentice-Hall, Nov. 1, 1997, p.169).

In the amplifier 900 shown in FIG. 10, a signal which is input via a terminal 901 is applied to a base of a transistor 910. The signal is amplified, led through a collector, and taken out at an output terminal 902. To the base, a bias Vb is applied via a resistor 921. To the collector, a bias Vc is applied via an inductor 922. In order to ensure separation between the collector bias and the base bias, a coupling capacitor 920 which exhibits a sufficiently small impedance at a fundamental frequency fc is connected at the base side.

Between the base and the collector of the transistor 910, there exists a parasitic capacitor 923 (having a capacitance Cp). An inductor 924 (having a reactance Lx) is connected to the parasitic capacitor 923 in parallel. It is assumed herein that the reactance Lx of the inductor 924 is chosen so that parallel resonance occurs with the parasitic capacitor 923 at the frequency fc at which amplification is expected, and that eq. 1 below is satisfied at the frequency fc (angular frequency $\omega=2\pi fc$):

$$Lx \times Cp = 1/\omega^2 \qquad \text{eq. 1}$$

By prescribing such a reactance value for the inductor 924, the inductor 924 and the parasitic capacitor 923 function so that a parallel resonance occurs between the base and the collector, thus maximizing the impedance. Since power feedback is suppressed as a result of this, a decrease in the gain of the transistor is reduced. By thus reducing the decrease in the gain of the transistor, it becomes possible to reduce the decrease in the power added efficiency (PAE) of the amplifier.

FIG. 11 is a diagram illustrating an exemplary structure of a transmitter 930 which performs a polar coordinate modulation (Polar Modulation) operation to substantially improve the operation efficiency of an amplifier (see, for example, U.S. Pat. No. No. 6,256,482). In the transmitter 930 shown in FIG. 11, a digital baseband signal which has been subjected to a π/4 shift QPSK(Quadrature Phase Shift Keying) modulation is input to a signal generation section 931, which is composed of a DSP(Digital Signal Processor) and a DAC(Digital to Analog Converter). The signal generation section 931 extracts a phase component from the digital baseband signal, and outputs it as a phase control signal Eph(t). Moreover, the signal generation section 931 extracts an amplitude component from the digital baseband signal, and outputs it as an amplitude modulation signal Emag(t).

The phase control signal Eph(t) is input to a quadrature modulator 932. Based on the phase control signal Eph(t), the quadrature modulator 932 modulates a carrier signal having a frequency f0, and outputs a phase modulated signal on which the phase control signal Eph(t) is superposed, such that the phase control signal Eph(t) has a certain envelope. A filter 933 removes any unwanted signal component from the phase modulated signal. The output signal from the filter 933 is input to a three-staged power amplification block including a driver-stage amplifier 934, an inter-stage amplifier 935, and a last-stage amplifier 936, the three stages being in a serial connection in this order.

The driver-stage amplifier 934 has a certain voltage being supplied to its power terminal 937 from a battery. The driver-stage amplifier 934 amplifies the phase modulated signal, and inputs the amplified signal to the inter-stage amplifier 935.

On the other hand, the amplitude modulation signal Emag(t) is amplified by a high-efficiency Class D amplifier 938. The filter 939 removes any unwanted component from the signal output signal from the Class D amplifier 938, and outputs the resultant signal as an amplitude modulation signal Efm(t). The amplitude modulation signal Efm(t) is split into two portions. That is, the amplitude modulation signal Efm(t) is input to a power supply section (not shown) of the inter-stage amplifier 935 and to a power supply section (not shown) of the last-stage amplifier 936.

In accordance with the amplitude modulation signal Efm(t) which is input to the power supply section, the inter-stage amplifier 935 amplifies or attenuates the phase modulated signal which is output from the driver-stage amplifier 934.

The last-stage amplifier 936 mixes the phase modulated signal which is output from the inter-stage amplifier 935 and the amplitude modulation signal Efm(t) which is input to its power supply section, and thus outputs a π/4 shift QPSK modulated signal having been superposed on the carrier signal. It is assumed that the envelope of the π/4 shift QPSK modulated signal has a voltage Eo(t).

Thus, a phase modulated signal and an amplitude modulation signal are generated from a digital baseband signal, and the amplitude modulation signal having been input to the power supply section of the last-stage amplifier 936 is mixed with the phase modulated signal. In this manner, a signal which has been subjected to a polar coordinate modulation (Polar Modulation) in accordance with the digital baseband signal is obtained as an output.

Now, problems associated with the amplifier shown in FIG. 10 will be described. In practice, the transistor not only includes a parasitic capacitor, but also inherently includes a base-collector capacitance (referred to as an "intrinsic capacitor") within the transistor.

FIG. 12 is a schematic diagram illustrating an equivalent circuit of the transistor 910 shown in FIG. 10. A resistor 912 and a capacitor 913 exist between the base and the emitter. A constant-current source 914 and an output resistance 915 exist between the collector and the emitter. An intrinsic capacitor (base-collector capacitance) 911 exists between the base and the collector.

In the case of an amplifier for transmission signals, unlike in an amplifier for received signals, a "large-sized" transistor is generally required in order to be able to output a high-power signal. As a result of this, the intrinsic capacitor 911 has a large capacitance, and the capacitance of the intrinsic capacitor 911 becomes more dominant than is the capacitance of the parasitic capacitor 923 as shown in FIG. 10. Therefore, merely providing the inductor 924 which resonates with the parasitic capacitor 923 shown in FIG. 10 (as is described in the aforementioned document authored by Behzad Razavi) causes a shift in the resonance frequency, thereby making it difficult to sufficiently prevent a gain decrease at the desired frequency (hereinafter this problem will be referred to as "the first problem").

In the communication techniques of the recent years, it is a requirement for the amplifier to have a uniform gain over a wide frequency range. In the amplifier 900 shown in FIG. 10, the Q value of the parallel resonance circuit composed of the inductor 924 and the parasitic capacitor 923 is increased due to the low resistance component. This high Q value means that the impedance of the resonance circuit may greatly vary depending on the frequency, thus preventing the amplifier from having a uniform gain over a wide frequency range (hereinafter this problem will be referred to as "the second problem").

Next, problems associated with the transmitter shown in FIG. 11 will be described. First, the operation of the last-stage amplifier 936 will be specifically described. In general, a transmitter in a mobile phone must be able to control the output power level depending on the distance from a base station. Hereinafter, such control of output power will simply be referred to as "power control". In order to be attain such power control, the transmitter must have a wide dynamic range. Herein, a case will be discussed where the average output power of the output modulated signal needs to be varied by a range of 20 dBm, from 10 dBm to 30 dBm.

FIG. 13 is a graph illustrating the relationship between the source voltage Vcc and the output voltage Vo in the last-stage amplifier 936 shown in FIG. 11. Granted that the last-stage amplifier 936 is always operating in a saturation region, basically, the output voltage Vo increases in proportion with the source voltage Vcc, as shown in the area enclosed by dotted lines in FIG. 13.

The π/4 QPSK modulated signal is a signal whose amplitude varies with time. For a given average power, the amplitude of the π/4 QPSK modulated signal has a dynamic range of about 18 dB, from +3 dB to −15 dB.

By allowing the amplitude modulation signal Efm(t) to vary within range A of source voltage Vcc, a modulated signal having a maximum average power of 30 dBm can be output. Within range A, the output voltage Vo varies linearly with respect to the source voltage Vcc. Therefore, as accurate amplitude information which is in proportion with the amplitude modulation signal Efm(t), the last-stage amplifier 936 outputs a π/4 shift QPSK modulated signal having the envelope Eo(t).

On the other hand, by allowing the amplitude modulation signal Efm(t) to vary within range B of source voltage Vcc, a modulated signal having a minimum average power of 10 dBm can be output. Within range B, the output power Vo does not vary linearly with respect to the source voltage Vcc linearly. Therefore, the output modulated signal is distorted, i.e., the envelope Eo(t) has inaccurate amplitude information. This results in a deteriorated communication quality.

Next, the reason why the output voltage Vo does not vary linearly with respect to the source voltage Vcc within range B will be described.

In order for the output voltage Vo to vary linearly, the last-stage amplifier 936 must be operating entirely within the saturation region.

Regions X and Y in FIG. 13 are regions in which the output voltage Vo does not vary linearly because the last-stage amplifier 936 is not operating within the saturation region.

In the region X, the input power is small relative to the source voltage Vcc, and therefore the last-stage amplifier 936 does not saturate. Thus, the output voltage Vo does not vary despite the increasing source voltage Vcc.

The source voltage of the inter-stage amplifier 935 varies so as to result in the same potential as that defining the source voltage of the last-stage amplifier 936. Therefore, in the region Y, the inter-stage amplifier 935 cannot provide output power which is sufficient for allowing the last-stage amplifier 936 to saturate adequately.

A region Z is a region in which the output voltage Vo does not vary linearly although the last-stage amplifier 936 is operating within the saturation region. In the region Z, the input power is very large relative to the source voltage Vcc. Therefore, power may leak to the output side via the parasitic capacitor and the intrinsic capacitor in the last-stage amplifier 936, which explains the reason why the output power does not vary in the region Y.

Thus, because of the three regions X, Y, and Z, the transmitter shown in FIG. 11 has a narrow dynamic range (hereinafter this problem will be referred to as "the third problem").

As wireless communication increases in speed and in capacity in the years to come, transmission circuits will face even severer requirements as to being able to amplify a modulated signal over a wide dynamic range spanning from a low output level to a high output level, with a high efficiency and free of distortion. As described above, the transmitter shown in FIG. 11 has a third problem of having a narrow dynamic range. In addition, the transmitter shown in FIG. 11 has a fourth problem in that the dynamic range becomes even narrower as a higher modulation speed is used, for the following reason. The amplitude modulation signal Efm(t) is split into two portions so as to be input to the power supply section of the inter-stage amplifier 935 and to the power supply section of the last-stage amplifier 936. However, as the modulation speed increases, there emerges a discrepancy between the timing with which the amplitude of the output signal from the inter-stage amplifier 935 varies, and the timing with which the last-stage amplifier 936 performs amplitude modulation, thus making the dynamic range even narrower.

In view of the first and second problems above, a first object of the present invention is to provide an amplifier for transmission signals incorporating a "large-sized" transistor, such that it is possible to attain a gain which is relatively high and is uniform over a wide over a wide frequency range.

In view of the third and fourth problems above, a second object of the present invention is to provide a small-sized and inexpensive amplifier or transmitter capable of performing a polar coordinate modulation operation, such that a modulated signal can be amplified with a high efficiency and free of distortion over a wide dynamic range, without requiring complicated control.

SUMMARY OF THE INVENTION

Therefore, the present invention has the following features to attain the object mentioned above. According to the present invention, there is provided an amplifier for amplifying a high-frequency signal and outputting an amplified signal, comprising: an amplification element which is a bipolar transistor or field-effect transistor; and an inductor connected between a base and a collector or between a gate and a drain of the amplification element, wherein an inductance of the inductor is chosen so that, within a predetermined frequency range, a parallel resonance occurs with a parasitic capacitor of the amplification element and an intrinsic capacitor of the amplification element, the intrinsic capacitor being a base-collector capacitance or a gate-drain capacitance.

Preferably, the amplifier further comprises a resistor connected in series with the inductor.

Preferably, the amplifier further comprises a capacitor connected in parallel with the inductor.

Preferably, a capacitance of the capacitor is chosen so that, within the predetermined frequency range, a parallel resonance occurs with the parasitic capacitor, the intrinsic capacitor, and the inductor.

Preferably, a capacitance of the intrinsic capacitor varies with time in accordance with a bias applied to the amplification element, and a capacitance of the capacitor is varied so that, within the predetermined frequency range, a parallel resonance occurs with the parasitic capacitor, the intrinsic capacitor, and the inductor.

Preferably, a capacitance of the intrinsic capacitor varies with time in accordance with a bias applied to the amplification element, and the inductance of the inductor is varied so that, within the predetermined frequency range, a parallel resonance occurs with the parasitic capacitor, the intrinsic capacitor, and the capacitor.

Preferably, the amplifier further comprises a phase adjustment circuit including the inductor, wherein an impedance of the phase adjustment circuit is chosen so that a phase difference in a range from $-\frac{2}{3}\pi$ to $\frac{2}{3}\pi$ exists between: a leak signal leaking via the parasitic capacitor, the intrinsic capacitor, and the phase adjustment circuit; and the amplified signal output from the amplification element after amplification or attenuation thereby.

Preferably, the amplification element operates within a saturation region, and the inductance of the inductor is chosen so that a parallel resonance occurs with the parasitic capacitor and the intrinsic capacitor within the saturation region.

Preferably, the amplification element outputs a modulated signal by mixing a phase modulated signal which is input to the base or the gate and an amplitude modulation signal which is input to the collector or the drain.

According to the present invention, there is also provided a communication device comprising an amplifier for amplifying a high-frequency signal, the amplifier including: an amplification element which is a bipolar transistor or a field-effect transistor; and an inductor connected between a base and a collector or between a gate and a drain of the amplification element, wherein an inductance of the inductor is chosen so that, within a predetermined frequency range, a parallel resonance occurs with a parasitic capacitor of the amplification element and an intrinsic capacitor of the amplification element, the intrinsic capacitor being a base-collector capacitance or a gate-drain capacitance.

According to the present invention, there is also provided a transmitter for transmitting a high-frequency signal, comprising: a signal generation section for outputting a phase control signal based on a phase component of a baseband signal and outputting an amplitude modulation signal based on an amplitude component of the baseband signal; a quadrature modulator for outputting a phase modulated signal by modulating a carrier signal in accordance with the phase control signal output from the signal generation section; and a last-stage amplifier for, by using the amplitude modulation signal as a bias voltage, mixing the phase modulated signal with the amplitude modulation signal to output a transmission signal, wherein the last-stage amplifier includes: an amplification element which is a bipolar transistor or a field-effect transistor; and an inductor connected between a base and a collector or between a gate and a drain of the amplification element, wherein an inductance of the inductor is chosen so that, within a predetermined frequency range, a parallel resonance occurs with a parasitic capacitor of the amplification element and an intrinsic capacitor of the amplification element, the intrinsic capacitor being a base-collector capacitance or a gate-drain capacitance.

Preferably, the transmitter further comprises: a driver-stage amplifier for amplifying the phase modulated signal output from the quadrature modulator; and an inter-stage amplifier for amplifying the amplified phase modulated signal output from the driver-stage amplifier, wherein, as the bias voltage, the amplitude modulation signal is input only to the last-stage amplifier, and the last-stage amplifier outputs, as the transmission signal, a mixture of the phase modulated signal output from the inter-stage amplifier and the amplitude modulation signal.

According to the present invention, even in the case of an amplifier for transmission signals that employs a "large-sized" transistor, the impedance between the base and collector can be increased at its transmission frequency. As a result, power feedback at the time of transmission is suppressed, whereby a high gain can be obtained. Furthermore, there are provided an amplifier, a transmitter, and a communication device which are small-sized and inexpensive and which make it possible to obtain a uniform gain over a wide frequency range and improve the dynamic range of a power amplifier.

By connecting a resistor in series with the inductor, a uniform (flat) gain curve can be obtained over a wide frequency range.

By connecting a capacitor in parallel with the inductor, the inductor can be downsized, whereby a small-sized amplifier can be provided. By allowing the capacitance of the capacitor to vary, it becomes possible to provide an amplifier which always has a high gain even in the case where the intrinsic capacitor fluctuates with time.

By allowing the inductance of the inductor to vary, it becomes possible to provide an amplifier which always has a high gain even in the case where the intrinsic capacitor fluctuates with time.

By providing a phase adjustment circuit, the dynamic range can be broadened.

By allowing the transistor to operate in the saturation region, the power added efficiency can be enhanced.

In the case where the amplifier according to the present invention is employed for a transmitter capable of performing a polar coordinate modulation, an amplitude modulation signal only needs to be input to its last-stage amplifier. As a result, a wide dynamic range can be maintained even with a high modulation speed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram illustrating the structure of an amplifier 400 according to a fourth embodiment of the present invention;

DESCRIPTION OF THE PREFERRED EMBODIMENTS (First Embodiment)

Figure 1A:
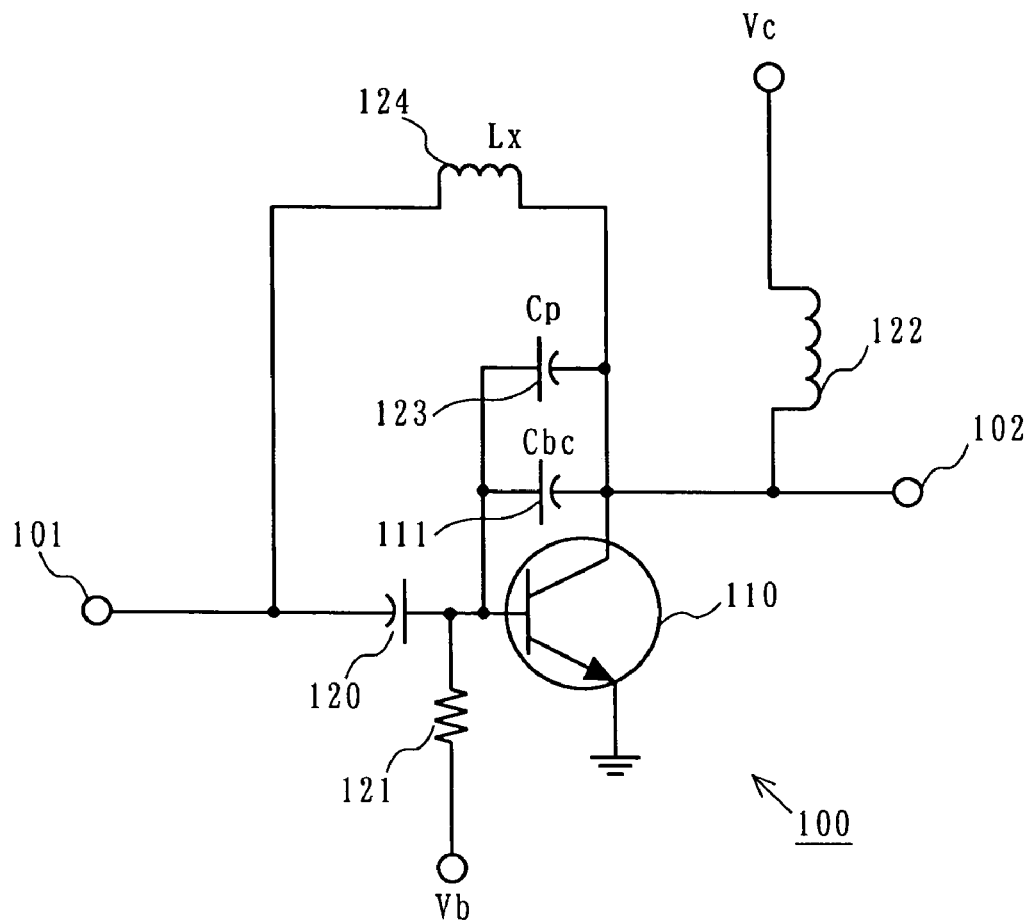
FIG. 1A is a circuit diagram illustrating the structure of an amplifier 100 according to a first embodiment of the present invention.

FIG. 1A is a circuit diagram illustrating the structure of an amplifier 100 according to a first embodiment of the present invention. As shown in FIG. 1A, the amplifier 100 comprises an input terminal 101, an output terminal 102, a transistor 110, a coupling capacitor 120, a resistor 121, an inductor 122, and an inductor 124.

In the amplifier 100 shown in FIG. 1A, a high-frequency signal which is input via a terminal 101 is applied to a base of a transistor 10. The signal is amplified, led through a collector, and taken out at an output terminal 102 as a transmission signal. To the base, a bias Vb is applied via a resistor 121. To the collector, a bias Vc is applied via an inductor 122.

Between the base and the collector of the transistor 110, a parasitic capacitor 123 and an intrinsic capacitor 111 are provided in a parallel connection. Furthermore, between the base and collector of the transistor 110, an inductor 124 (having an inductance Lx) is connected. Although the intrinsic capacitor 111 is a base-collector capacitance which lies internal to the transistor 110, the intrinsic capacitor 111 is intentionally drawn outside of the transistor 110 in FIG. 1A for ease of understanding. In the present specification, a "parasitic capacitor" refers to a capacitance which becomes parasitic when a transistor is packaged, and should be distinguished from a base-collector capacitance.

In order to ensure separation between the collector bias and the base bias, a coupling capacitor 120 which exhibits a sufficiently small impedance at a fundamental frequency fc is connected at the base side.

It is assumed herein that the reactance Lx of the inductor 124 is chosen so that parallel resonance occurs with the parasitic capacitor 123 (having a capacitance Cp) and the intrinsic capacitor 111 (having a capacitance Cbc) at the frequency fc at which amplification is expected. In other words, the reactance Lx is chosen so that eq. 2 below is satisfied at the frequency fc (angular frequency $\omega=2\pi fc$):

$$Lx \times (Cbc+Cp)=1/\omega^2 \qquad \text{eq. 2.}$$

Figure 1B:
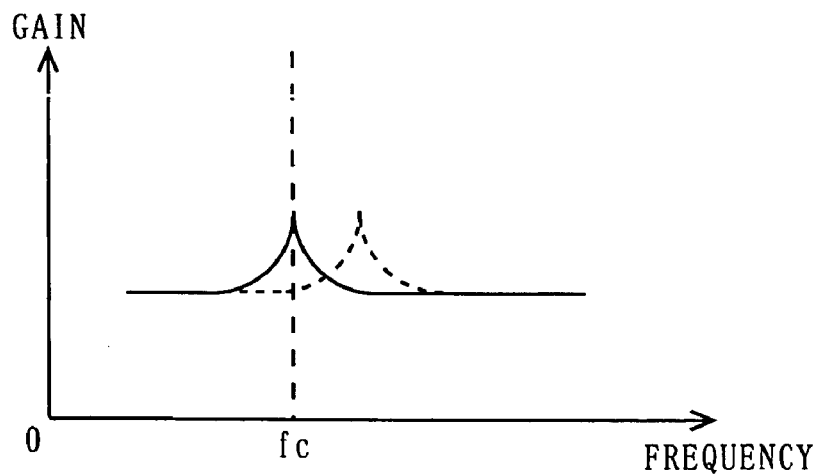
FIG. 1B is a graph schematically showing the gain of the amplifier 100 at each frequency.

FIG. 1B is a graph schematically showing the gain of the amplifier 100 at each frequency. In FIG. 1B, the solid line represents the gain of the amplifier 100 in the case where the value of the inductance Lx is prescribed so that the relationship of eq. 2 is satisfied, i.e., so that the inductor 124 undergoes a parallel resonance with the parasitic capacitor 123 and the intrinsic capacitor 111. The dotted line represents the gain of the amplifier 100 in the case where the value of the inductance Lx is prescribed so that the relationship of eq. 1 is satisfied, i.e., so that the inductor 124 resonates only with the parasitic capacitor 123. As seen from FIG. 1B, given the communication frequency fc, a higher gain is being realized with the solid line than with the dotted line.

Thus, by designing the inductor 124 so that it undergoes a parallel resonance with the parasitic capacitor 123 and the intrinsic capacitor 111, the impedance between the base and collector can be increased at the transmission frequency. As a result, power feedback is suppressed at the time of transmission, thus preventing decrease in the gain of the amplifier. Thus, the for transmission signals.

(Second Embodiment)

Figure 2A:
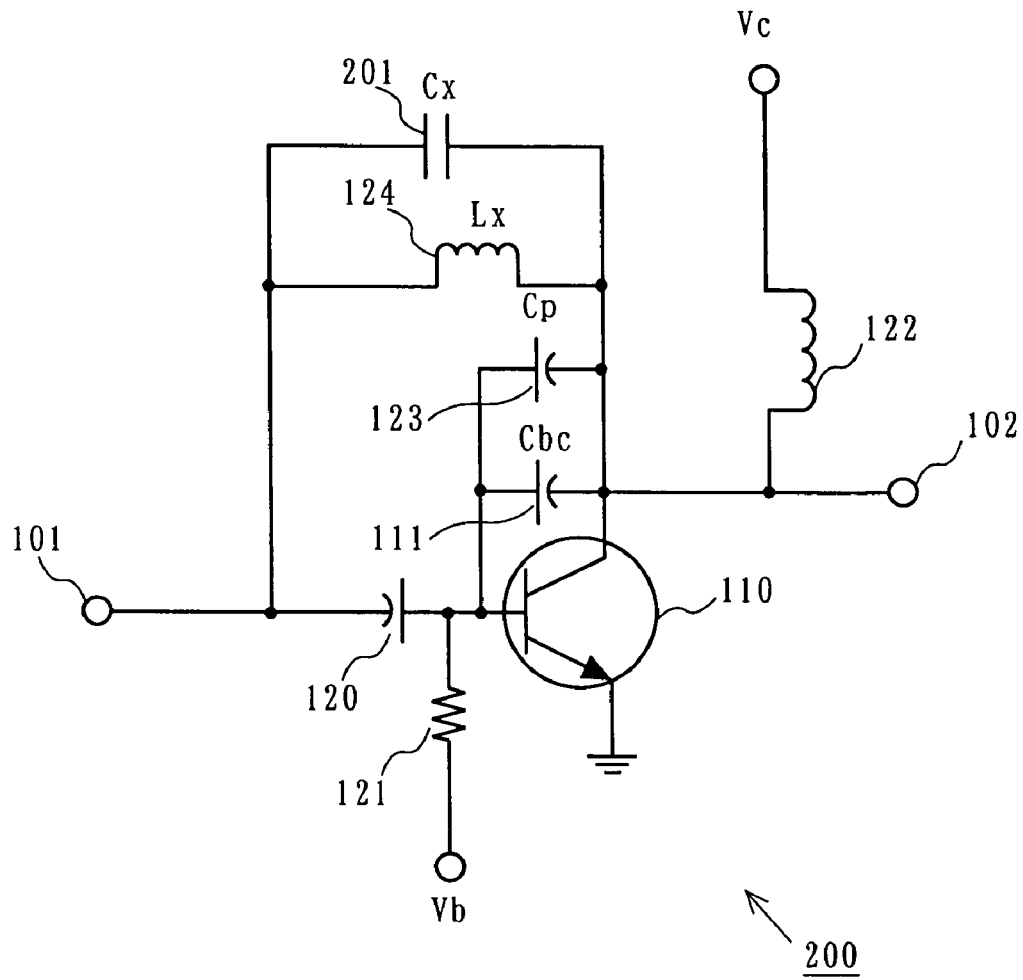
FIG. 2A is a circuit diagram illustrating the structure of an amplifier 200 according to a second embodiment of the present invention.

FIG. 2A is a circuit diagram illustrating the structure of an amplifier 200 according to a second embodiment of the present invention. The amplifier 200 shown in FIG. 2A is similar in construction to the amplifier 100 according to the first embodiment except that a further capacitor 201 (having a capacitance Cx) is connected between the base and collector.

Since the capacitor 201 is in a parallel connection with the parasitic capacitor 123 (having a capacitance Cp) and the intrinsic capacitor 111 (having a capacitance Cbc), the overall capacitance value is increased. Therefore, the value of the reactance Lx which satisfies the relationship of eq. 3 below can be smaller than that which satisfies the relationship of eq. 2:

$$Lx \times (Cbc + Cp + Cx) = 1/\omega^2 \qquad \text{eq. 3.}$$

The physical size of the inductor can be more reduced as the value of LX decreases. Therefore, according to the second embodiment, by using an inductor 124 having a reactance Lx which satisfies the relationship of eq. 3, the entire circuitry can be downsized as compared to the circuitry of the first embodiment.

Figure 2B:
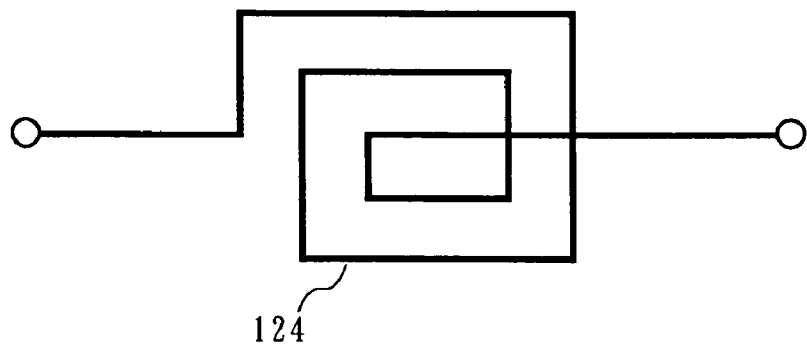
FIG. 2B is a diagram illustrating an exemplary inductor 124.

FIG. 2B is a diagram illustrating an exemplary inductor 124. FIG. 2B illustrates an example where the inductor 124 in the amplifier 200 shown in FIG. 2A is implemented as a spiral inductor. A spiral inductor provides greater inductance as it increases in area or as its turns increase in number. Therefore, the amplifier 200 can satisfy the resonating condition with a smaller-area inductor 124, whereby the entire circuitry can be downsized.

(Third Embodiment)

Figure 3A:
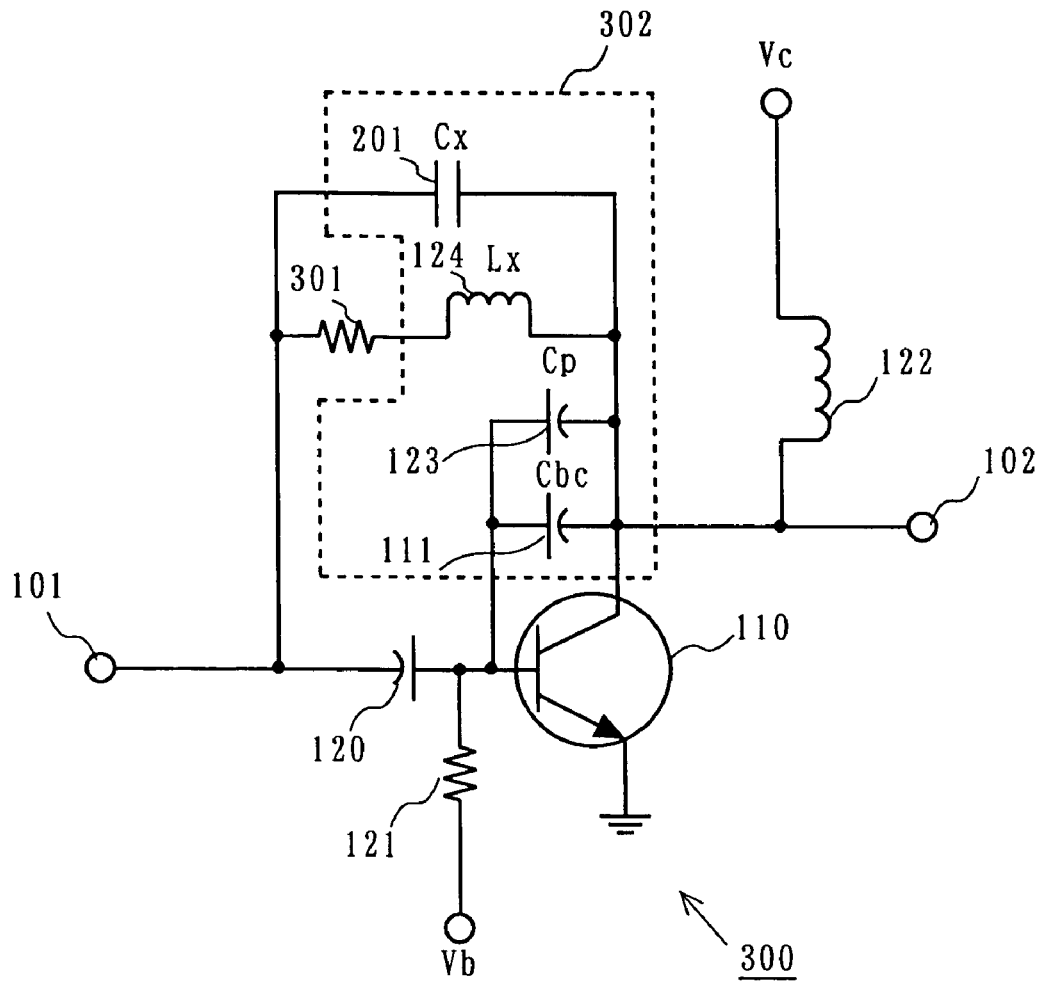
FIG. 3A is a circuit diagram illustrating the structure of an amplifier 300 according to a third embodiment of the present invention.
Figure 3B:
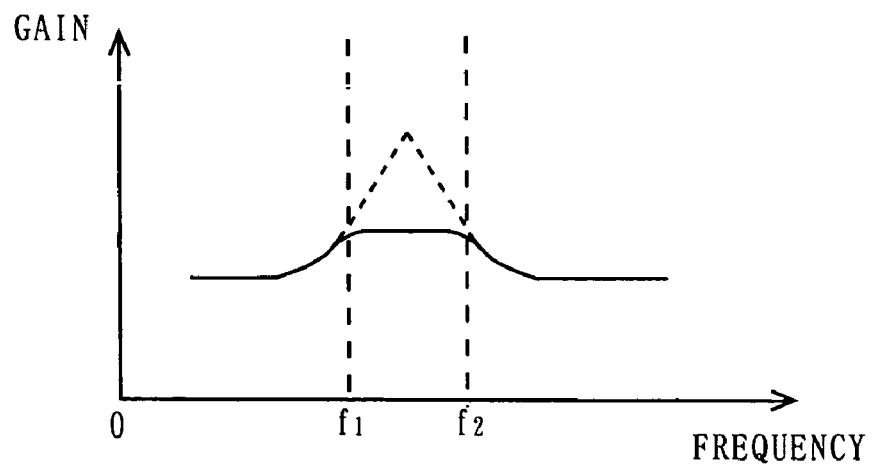
FIG. 3B is a graph showing the frequency characteristics of the gain of the amplifier 300.

FIG. 3A is a circuit diagram illustrating the structure of an amplifier 300 according to a third embodiment of the present invention. FIG. 3B is a graph showing the frequency characteristics of the gain of the amplifier 300. The amplifier 300 shown in FIG. 3A is similar in construction to the amplifier 200 shown in FIG. 2A, except that a resistor 301 is connected in series with the inductor 124.

In the amplifier 300, if a parallel resonance circuit 302 which is composed of the parasitic capacitor 123 (having a capacitance Cp), the intrinsic capacitor 111 (having a capacitance Cbc), the inductor 124 (reactance Lx), and the capacitor 201 (having a capacitance Cx) did not have a resistance component, the parallel resonance circuit 302 would have a very large Q value, so that steep changes in impedance would occur along the frequency axis. In order to obtain a uniform gain in a communication band from f1 to f2, for example, such steep changes in the resonance characteristics would allow the gain to substantially change with frequency, as shown by the dotted line in FIG. 3B. As a result, the objective of obtaining a uniform gain over a wide frequency range would not be attained.

Therefore, according to the third embodiment, the resistor 301 is connected in series with the inductor 124 in order to reduce the Q value of the parallel resonance circuit 302, thereby ensuring that a gentle resonance characteristics curve can be obtained with respect to different frequencies. Thus, as indicated by the solid line in FIG. 3B, gain changes in the communication band f1 to f2 can be reduced, thus making it possible to obtain a uniform gain over a wide frequency range.

(Fourth Embodiment)

FIG. 4 is a circuit diagram illustrating the structure of an amplifier 400 according to a fourth embodiment of the present invention. The amplifier 400 shown in FIG. 4 is similar in construction to the amplifier 300 of FIG. 3 except that the inductor 124 and the capacitor 201 are replaced with a variable inductor 401 and a variable capacitor 402, respectively. Instead of replacing both of the inductor 124 and the capacitor 201, it will be appreciated that only one of the inductor 124 and the capacitor 201 may be replaced with a corresponding variable element. In other words, only the inductor 124 maybe replaced with the variable inductor 401, or only the capacitor 201 may be replaced with the variable capacitor 402.

An external control section (not shown) is employed to cause changes in the value of the variable inductor 401 or the variable capacitor 402 in accordance with temporal changes occurring in a voltage Vbc(t) between the base and collector (where t represents time), which in turn occur in accordance with temporal changes in the bias. As the voltage Vbc(t) between the base and collector changes, the capacitance Cbc(t) of the intrinsic capacitor 111 also changes, and therefore the resonating condition of the resonance circuit fluctuates with time, making it impossible to obtain a high gain. Therefore, the control section is employed to vary the capacitance Cx(t) of the variable capacitor 402 in accordance with the changes in the voltage Vbc(t) between the base and collector, thereby ensuring that the resonating condition is satisfied in a predetermined frequency range used for transmission. As a result, a high-gain amplifier can be provided even in the case where the voltage between the base and collector varies with time. In addition or in the alternative, the reactance Lx(t) of the variable inductor 401 may be varied in accordance with changes in the voltage Vbc(t) between the base and collector. In this case, too, the resonating condition is satisfied in a predetermined frequency range used for transmission, so that a high-gain amplifier can be provided even in the case where the voltage between the base and collector varies with time. Since the resistor 301 is connected, it is possible to maintain a flat gain curve over a wide frequency range.

For example, consider a case where the collector voltage Vc(t) is allowed to fluctuate in amplitude such that an amplitude modulation is performed in the amplifier 400. In this case, the voltage Vbc(t) between the base and collector varies in accordance with the modulation speed, and also the intrinsic capacitor 111 (having a capacitance Cbc(t)) of the transistor 110 varies in accordance with the voltage Vbc(t) between the base and collector. As a result, the resonating condition of the resonance circuit fluctuates with time, making it impossible to obtain a high gain. Accordingly, the inductance Lx(t) of the variable inductor 401 is allowed to change in accordance with the capacitance Cbc(t) of the intrinsic capacitor 111 to ensure that parallel resonance occurs with the parasitic capacitor 123, the intrinsic capacitor 111 (which varies with time in accordance with the bias), and the variable capacitor 402, whereby the parallel resonance condition can be maintained at the fundamental frequency fc and a high gain is realized. Similar effects can also be obtained by allowing the capacitance Cx(t) of the variable capacitor 402 to vary in accordance with the capacitance Cbc(t) to ensure that parallel resonance occurs with the parasitic capacitor 123, the intrinsic capacitor 111 (which varies with time in accordance with the bias), and the variable inductor 401, thus maintaining the resonating condition. In such a case, for example, the control section may control the value of the variable capacitor 402 or the variable inductor 401 in accordance with the value of the collector voltage Vc(t).

(Fifth Embodiment)

Figure 5:
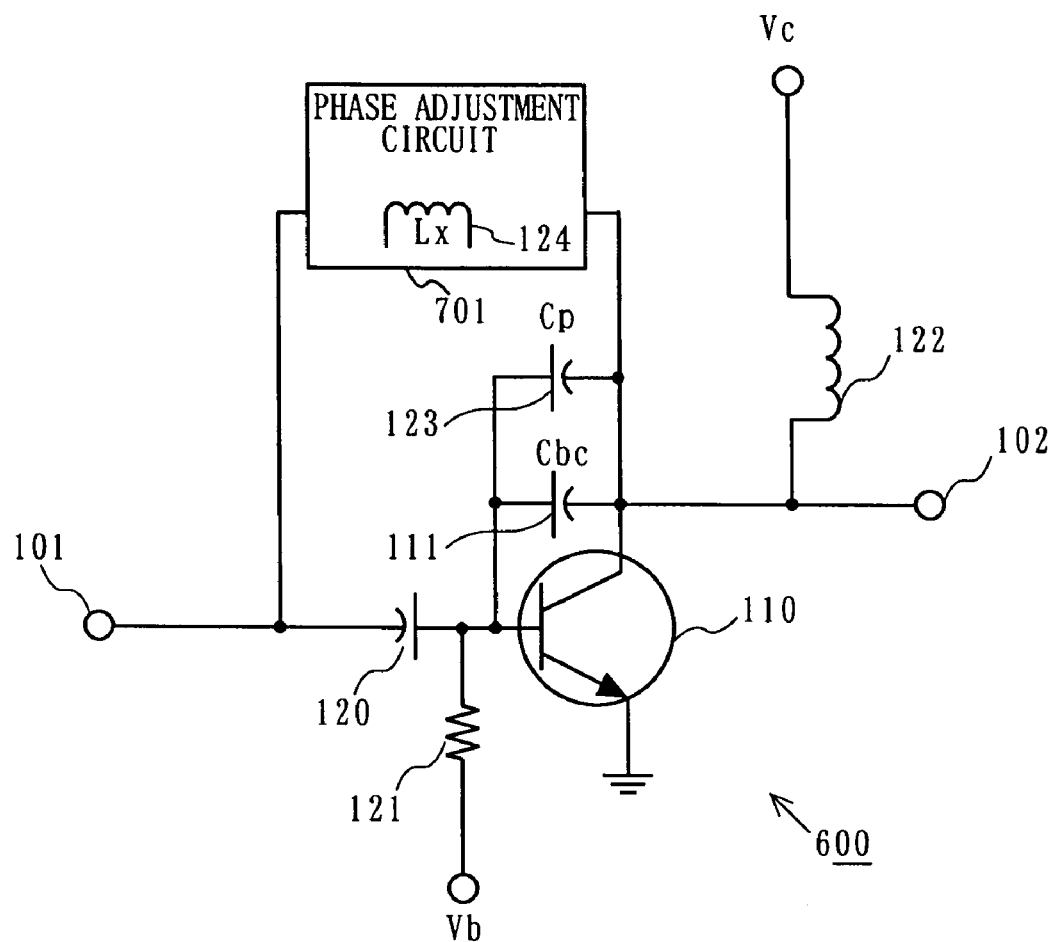
FIG. 5 is a circuit diagram illustrating the structure of an amplifier 600 according to a fifth embodiment of the present invention.

FIG. 5 is a circuit diagram illustrating the structure of an amplifier 600 according to a fifth embodiment of the present invention. The amplifier 600 shown in FIG. 5 comprises a phase adjustment circuit 701, which includes an inductor 124. Otherwise, the amplifier 600 is similar in construction to the amplifier 100 of the first embodiment.

The impedance of the phase adjustment circuit 701 is selected so that a phase difference between a leak signal which leaks via a circuit composed of the parasitic capacitor 123, the intrinsic capacitor 111, and the phase adjustment circuit 701; and the amplified signal (i.e., the signal which is output from the transistor 110 after amplification or attenuation thereby) is in the range from $-\frac{2}{3}\pi$ to $\frac{2}{3}\pi$. More preferably, the impedance of the phase adjustment circuit 701 is selected so that the phase difference between a leak signal which leaks via the circuit composed of the parasitic capacitor 123, the intrinsic capacitor 111, and the phase adjustment circuit 701; and the amplified signal which is output from the transistor 110 after amplification or attenuation thereby is $\pi$.

Figure 6A:
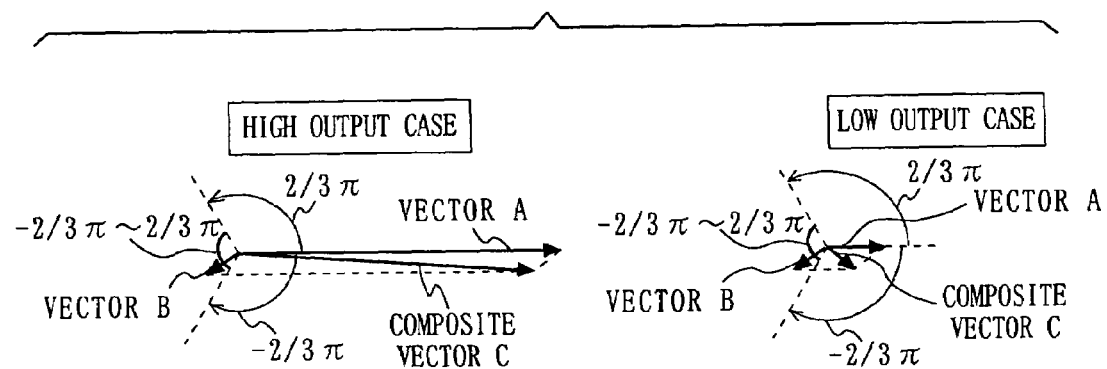
FIG. 6A is a diagram illustrating a phase relationship between: a leak signal which leaks via a circuit composed of a parasitic capacitor 123, an intrinsic capacitor 111, and a phase adjustment circuit 701; and an amplified signal which is output from a transistor 110 after amplification or attenuation thereby (showing a case where there is a phase difference in the range from $-\frac{2}{3}\pi$ to $\frac{2}{3}\pi$ between the leak signal and the amplified signal)
Figure 6B:
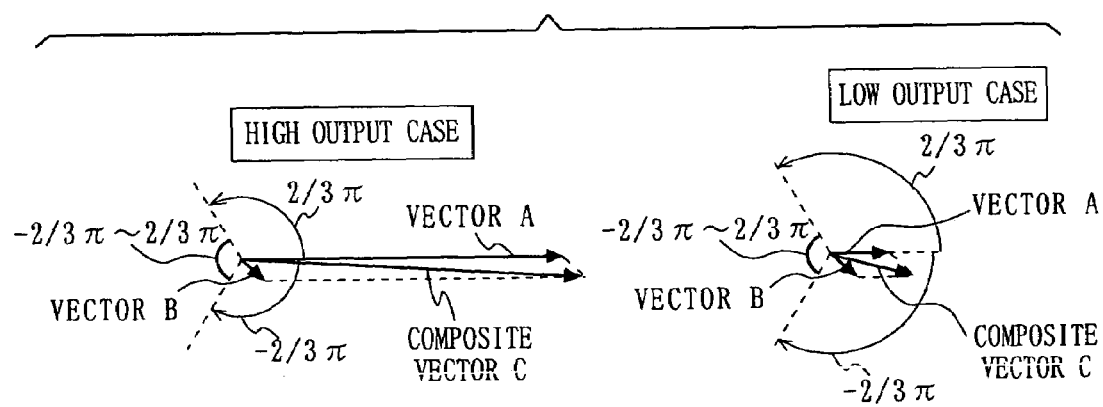
FIG. 6B is a diagram illustrating a phase relationship between: a leak signal which leaks via a circuit composed of a parasitic capacitor 123, an intrinsic capacitor 111, and a phase adjustment circuit 701; and an amplified signal which is output from a transistor 110 after amplification or attenuation thereby (showing a case where there is a phase difference other than that in the range from $-\frac{2}{3}\pi$ to $\frac{2}{3}\pi$ between the leak signal and the amplified signal)

FIGS. 6A and 6B are diagrams each illustrating a phase relationship between: a leak signal which leaks via the circuit composed of the parasitic capacitor 123, the intrinsic capacitor 111, and the phase adjustment circuit 701; and the amplified signal which is output from the transistor 110 after amplification or attenuation thereby. In FIGS. 6A and 6B, a vector of the amplified signal is denoted as vector A; and a vector of the leak signal is denoted as vector B; and a vector of the compound signal of the leak signal and the amplified signal is denoted as composite vector C. FIG. 6A shows a case where there is a phase difference in the range from $-\frac{2}{3}\pi$ to $\frac{2}{3}\pi$ between the leak signal and the amplified signal (i.e., the angle of vector B with respect to vector A is in the range from $-\frac{2}{3}\pi$ to $\frac{2}{3}\pi$). FIG. 6B shows a case where the phase difference between the leak signal and the amplified signal is outside the range from $-\frac{2}{3}\pi$ to $\frac{2}{3}\pi$ (i.e., the angle of vector B with respect to vector A is outside the range from $-\frac{2}{3}\pi$ to $\frac{2}{3}\pi$).

First, a case where there is a relatively high output, i.e., in the case where vector A has a relatively large magnitude, will be considered. In this case, as shown in FIGS. 6A and 6B, the magnitude of vector B exerts no substantial influence of the magnitude of composite vector C.

Next, a case where there is a relatively low output, i.e., in the case where vector A has a relatively small magnitude, will be considered. It will be seen that the magnitude of composite vector C is remarkably smaller for the case of FIG. 6A, where the angle difference between vector A and vector B is in the range from $-\frac{2}{3}\pi$ to $\frac{2}{3}\pi$ (i.e., the phase difference between the leak signal and the amplified signal is in the range from $-\frac{2}{3}\pi$ to $\frac{2}{3}\pi$), than for the case of FIG. 6B, where the angle difference between vector A and vector B is outside the range from $-\frac{2}{3}\pi$ to $\frac{2}{3}\pi$ (i.e., the phase difference between the leak signal and the amplified signal is outside the range from $-\frac{2}{3}\pi$ to $\frac{2}{3}\pi$).

Therefore, by selecting the impedance of the phase adjustment circuit 701 so that the angle difference between vector A and vector B is in the range from $-\frac{2}{3}\pi$ to $\frac{2}{3}\pi$ (i.e., the phase difference between the leak signal and the amplified signal is in the range from $-\frac{2}{3}\pi$ to $\frac{2}{3}\pi$), it becomes possible, when outputting a low power level by reducing the source voltage of the transistor (collector or drain voltage), to obtain a further reduced output power level. As a result, any unwanted reduction of dynamic range at the lower-output end that is associated with vector B can be minimized, thus allowing for a broader dynamic range. In the case where the impedance of the phase adjustment circuit 701 is selected so that the angle difference between vector A and vector B is $\pi$, it can be ensured that the compound signal is always smaller than the amplified signal, thus allowing for a broader dynamic range.

The above-described phase adjustment circuit 701 can be designed in the following manner. Firstly, an inductor 124 is chosen which undergoes parallel resonance with the intrinsic capacitor 111 so that the leak signal leaking via the parasitic capacitor 123 and the intrinsic capacitor 111 is suppressed. Secondly, it is examined how much shift in the phase of the leak signal which leaks via the parasitic capacitor 123, the intrinsic capacitor 111, and the phase adjustment circuit 701 is introduced by the inductor 124 having been chosen. If the phase difference between the leak signal and the amplified signal is in the range circuit 701 can be composed only of the inductor 124. On the other hand, if it is found that the phase difference between the leak signal and the amplified signal is not within the range from $-\frac{2}{3}\pi$ to $\frac{2}{3}\pi$, a capacitor or an inductor may be connected in series or in parallel with the inductor 124 to ensure that the phase difference between the leak signal and the amplified signal again falls within the range from $-\frac{2}{3}\pi$ to $\frac{2}{3}\pi$.

Note that such a phase adjustment circuit may also be introduced in any of the second to fourth embodiments above.

The transistor 110 consumes most power when it is operating with a high output level. Therefore, if the transistor 110 is operating within the saturation region with a high gain, a high power added efficiency can be obtained from a total point of view. Therefore, in any of the first to fifth embodiments, it is preferable that the inductance of the inductor 124 or 401 which is connected to the transistor 110 is chosen so that parallel resonance occurs with the capacitance Cbc of the intrinsic capacitor 111 in the case where the transistor 110 is operating within the saturation region.

In any of the first to fifth embodiments, instead of a bipolar transistor, an amplification element such as a field-effect transistor may be employed as the transistor 110. In the case where a field-effect transistor is employed as the transistor 110, the gate-drain capacitance serves as the intrinsic capacitor.

(Sixth Embodiment)

Figure 7:
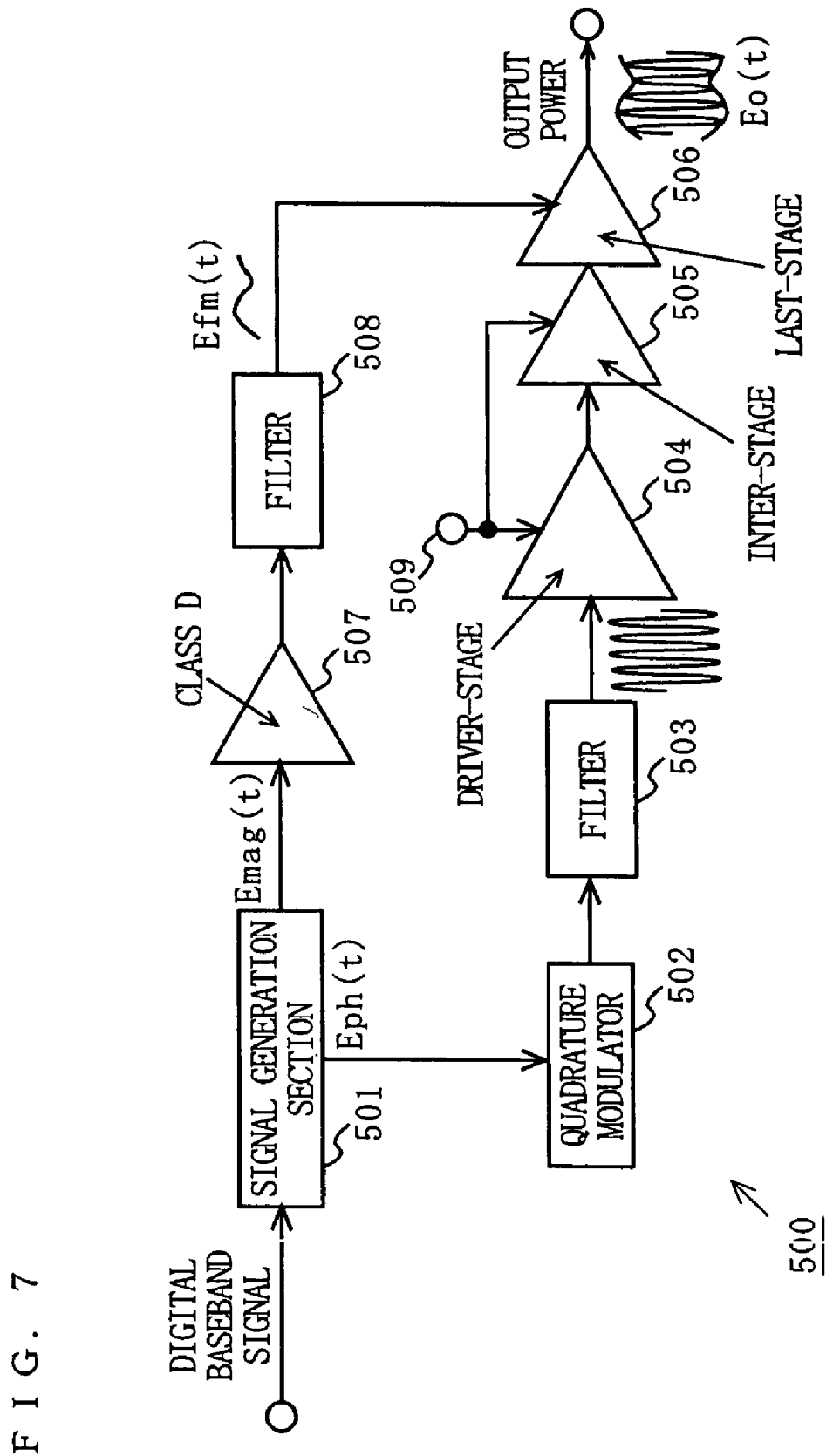
FIG. 7 is a block diagram illustrating the structure of a transmitter 500 according to a sixth embodiment of the present invention capable of performing a polar coordinate modulation operation.

FIG. 7 is a block diagram illustrating the structure of a transmitter 500 according to a sixth embodiment of the present invention capable of performing a polar coordinate modulation operation. As shown in FIG. 7, the transmitter 500 comprises a signal generation section 501, a quadrature modulator 502, a filter 503, a driver-stage amplifier 504, an inter-stage amplifier 505, a last-stage amplifier 506, a Class D amplifier 507, and a filter 508.

In the transmitter 500 shown in FIG. 7, a $\pi/4$ shift QPSK modulated digital baseband signal is input to a signal generation section 501 composed of a DSP(s) and a DAC(s). The signal generation section 501 extracts a phase component from the digital baseband signal, and outputs it as a phase control signal Eph(t). Moreover, the signal generation section 501 extracts an amplitude component from the digital baseband signal, and outputs it as an amplitude modulation signal Emag(t).

The phase control signal Eph(t) is input to a quadrature modulator 502. Based on the phase control signal Eph(t), the quadrature modulator 502 modulates a carrier signal having a frequency f0, and outputs a phase modulated signal on which the phase control signal Eph(t) is superposed, such that the phase control signal Eph(t) has a certain envelope. The filter 503 removes any unwanted signal component from the phase modulated signal. The output signal from the filter 503 is input to a three-staged power amplification block including a driver-stage amplifier 504, an inter-stage amplifier 505, and a last-stage amplifier 506, the three stages being in a serial connection in this order.

The driver-stage amplifier 504 and the inter-stage amplifier 505 have a certain voltage being supplied thereto via a power terminal 509, from a power supply section (not shown) such as a battery. The driver-stage amplifier 504 and the inter-stage amplifier 505 amplify the phase modulated signal, and input the amplified phase modulated signal to the last-stage amplifier 506.

On the other hand, the amplitude modulation signal Emag(t) is amplified by the high-efficiency Class D amplifier 507. The filter 508 removes any unwanted component from the signal output signal from the Class D amplifier 507, and outputs the resultant signal as an amplitude modulation signal Efm(t). The amplitude modulation signal Efm(t) is input to the power supply section of the last-stage amplifier 506.

The last-stage amplifier 506 is an amplifier according to any of the first to fifth embodiments. The last-stage amplifier 506 mixes the phase modulated signal which is output from the inter-stage amplifier 505 and the amplitude modulation signal Efm(t) which is input to the power supply section of the last-stage amplifier 506, and thus outputs a π/4 shift QPSK modulated signal having been superposed on the carrier signal. It is assumed that the envelope of the π/4 shift QPSK modulated signal has a voltage Eo(t).

Thus, a phase modulated signal and an amplitude modulation signal are generated from a digital baseband signal, and the amplitude modulation signal having been input to the power supply section of the last-stage amplifier 506 is mixed with the phase modulated signal. In this manner, a signal which has been subjected to a polar coordinate modulation (Polar Modulation) in accordance with the digital baseband signal is obtained as an output.

Next, the reason why employing an amplifier according to any of the first to fifth embodiments as the last-stage amplifier 506 enables amplification of a modulated signal without distortion over a wide dynamic range will be described. Herein, a case will be discussed where the output power of the modulated signal is power-controlled in a range of 40 dBm, from −10 dBm to +30 dBm.

Figure 8A:
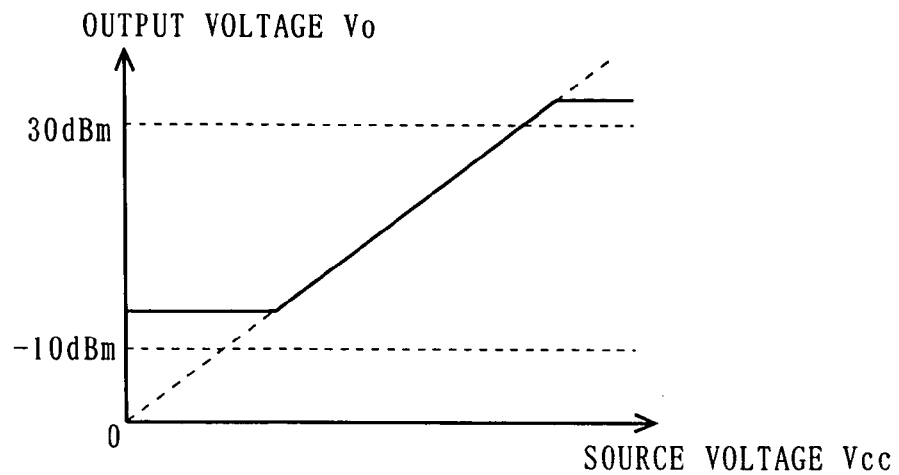
FIG. 8A is a graph showing the relationship between a source voltage Vcc and an output power Vo, in the case where a conventional amplifier lacking an inductor connected between its input and output is employed as a last-stage amplifier 506, with a high input power being supplied thereto.
Figure 8B:
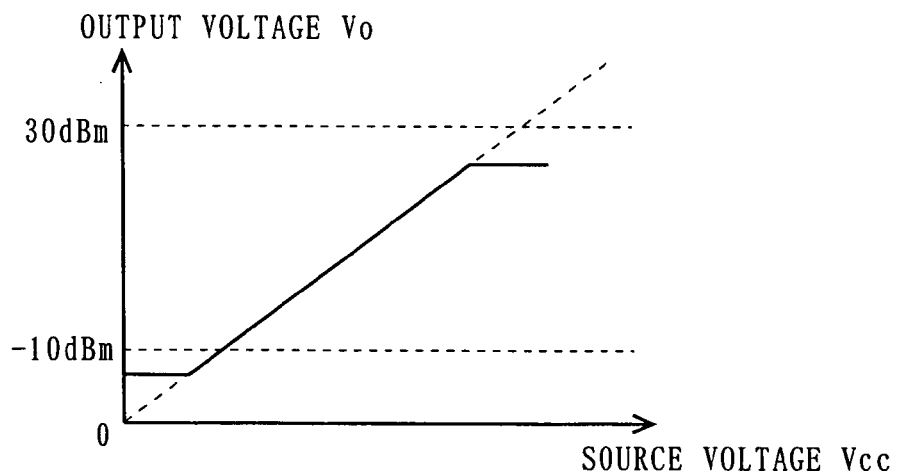
FIG. 8B is a graph showing the relationship between a source voltage Vcc and an output power Vo, in the case where a conventional amplifier lacking an inductor connected between its input and output is employed as a last-stage amplifier 506, with a low input power being supplied thereto.
Figure 8C:
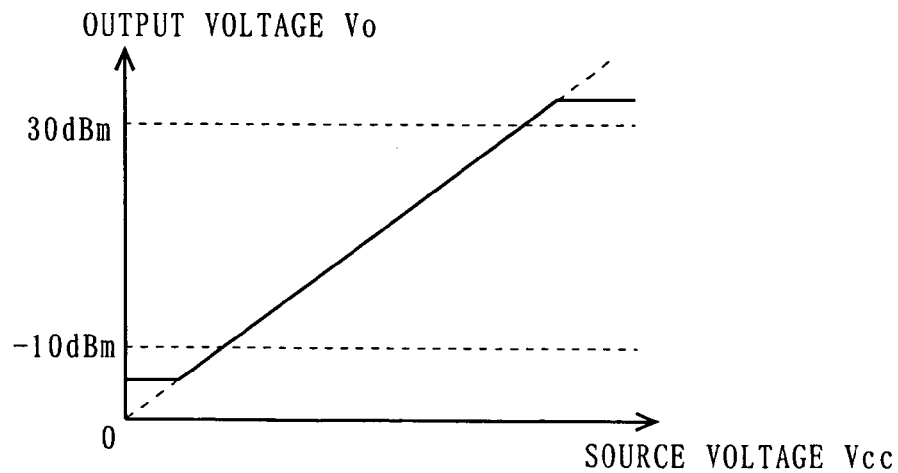
FIG. 8C is a graph showing the relationship between a source voltage Vcc and an output power Vo, in the case where an amplifier according to any one of the first to fifth embodiments, having an inductor connected between its input and output, is employed as a last-stage amplifier 506.

FIG. 8A is a graph showing the relationship between a source voltage Vcc and an output power Vo, in the case where a conventional amplifier lacking an inductor connected between its input and output is employed as a last-stage amplifier 506, with a high input power being supplied thereto. FIG. 8B is a graph showing the relationship between a source voltage Vcc and an output power Vo, in the case where a conventional amplifier lacking an inductor connected between its input and output is employed as a last-stage amplifier 506, with a low input power being supplied thereto. FIG. 8C is a graph showing the relationship between a source voltage Vcc and an output power Vo, in the case where an amplifier according to any one of the first to fifth embodiments, having an inductor connected between its input and output, is employed as a last-stage amplifier 506. Note that the source voltage Vcc corresponds to the voltage level of the amplitude modulation signal Efm(t).

If no inductor is connected between the input and the output of the last-stage amplifier 506, the gain will decrease. Therefore, in order to realize a desired high output voltage (corresponding to +30 dBm) or more, it becomes necessary to increase the input power to the last-stage amplifier 506. However, in a region of low output voltage, an increased input power leads to a greater input power being leaked via the intrinsic capacitor in the last-stage amplifier 506. Therefore, as shown in FIG. 8A, even if the source voltage Vcc is lowered, an output voltage Vo which is higher than a desired low voltage value (corresponding to −10 dBm) may be output. Conversely, by lowering the input power to the last-stage amplifier 506, as shown in FIG. 8B, an output voltage Vo which is lower than the desired low voltage value (corresponding to −10 dBm) may be realized, but the desired high output voltage (corresponding to +30 dBm) or more cannot be obtained. Thus, in the case where no inductor is connected between the input and output of the last-stage amplifier 506, the dynamic range becomes narrow.

On the other hand, an inductor which is connected between the input and output of the last-stage amplifier 506 increases the gain. Therefore, even if the input power is set to a low level as shown in FIG. 8B, the desired high output voltage (corresponding to +30 dBm) or more can still be obtained, while being able to obtain an output voltage Vo which is lower than the desired low voltage value (corresponding to −10 dBm).

Thus, providing an inductor between the input and output of the last-stage amplifier 506 provides a wide dynamic range.

Since the dynamic range is broadened, the amplitude modulation signal Efm(t) needs to be input only to the last-stage amplifier 506. Thus, a wide dynamic range can be maintained even when a high modulation speed is used.

Note that an amplifier according to any of the first to fifth embodiments may be used for any communication device other than a transmitter capable of performing a polar coordinate modulation operation. It will also be appreciated that such an amplifier may also be used for any device other than a communication device.

Figure 9:
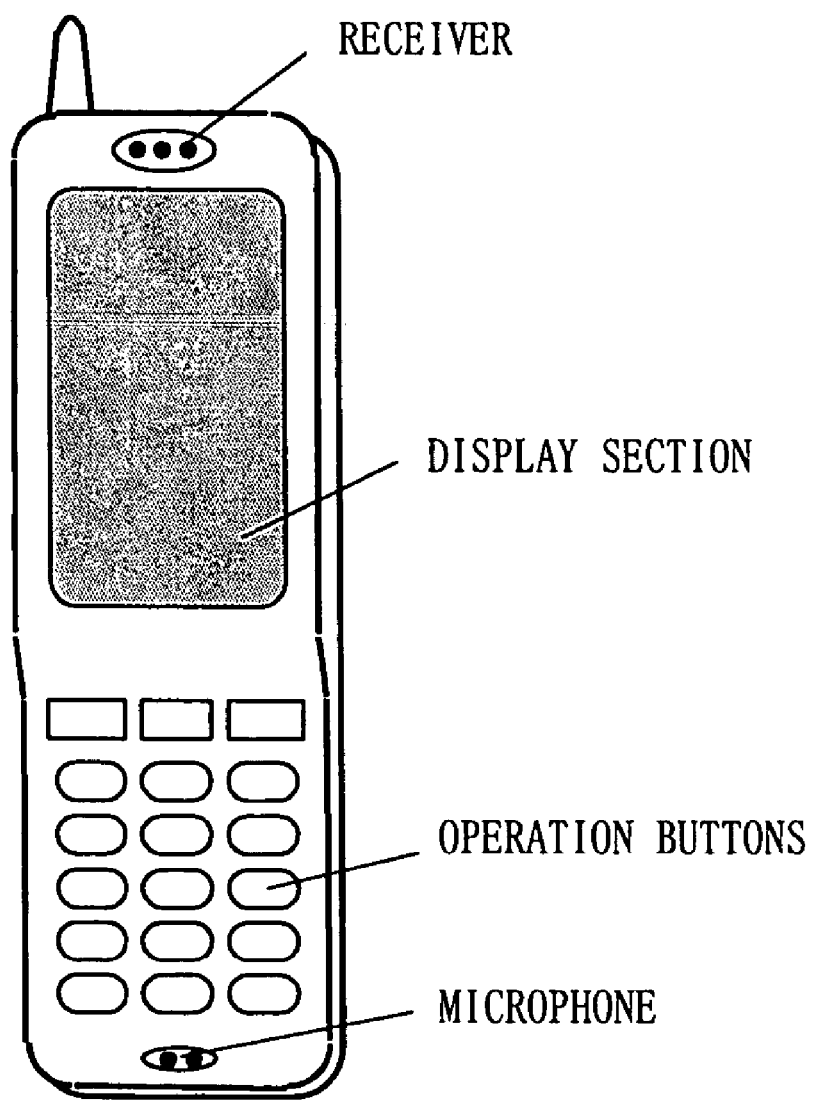
FIG. 9 is a front view showing a mobile phone to which an amplifier according to the present invention is applied.
Figure 10:
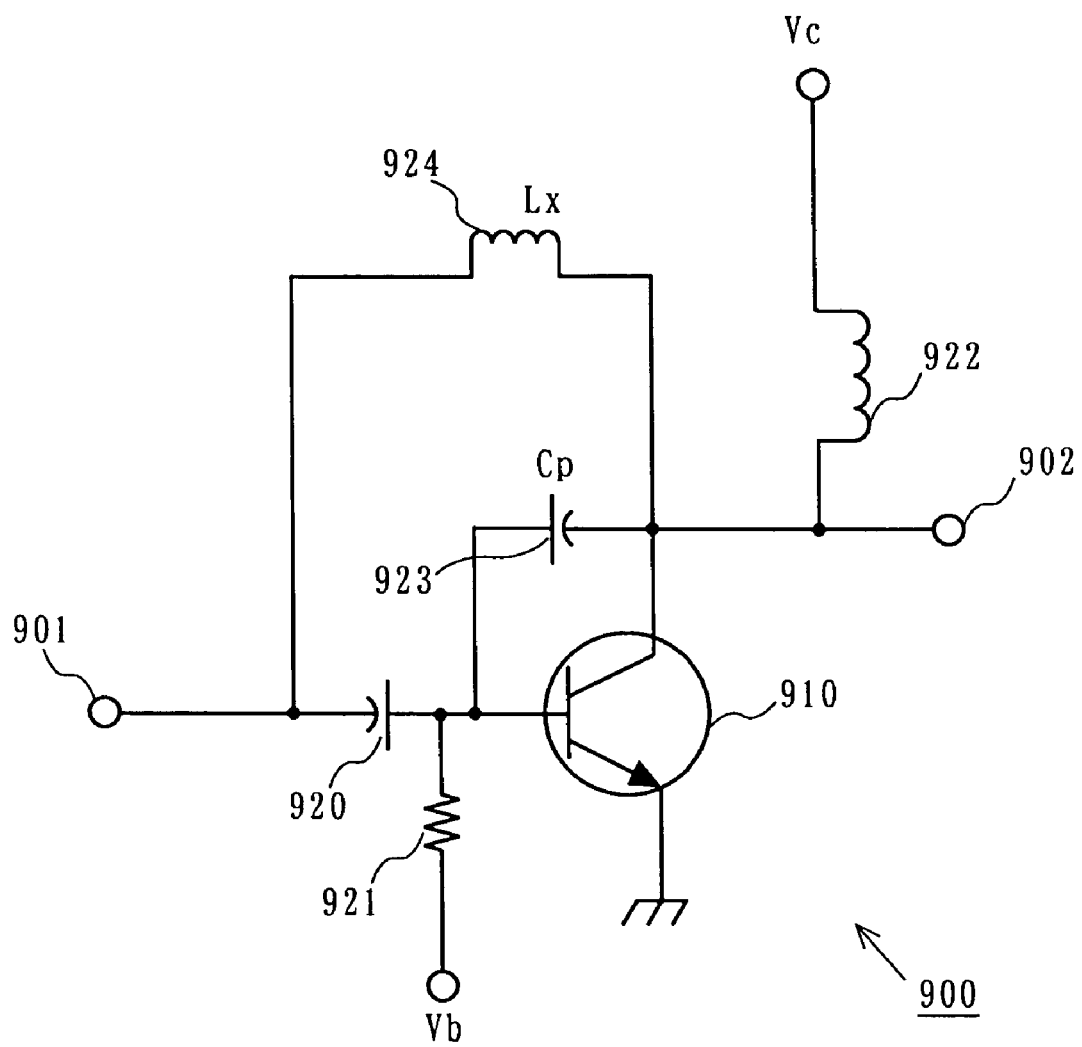
FIG. 10 is a diagram illustrating an exemplary structure of a conventional amplifier 900 designed for amplifying a weak received signal.
Figure 11:
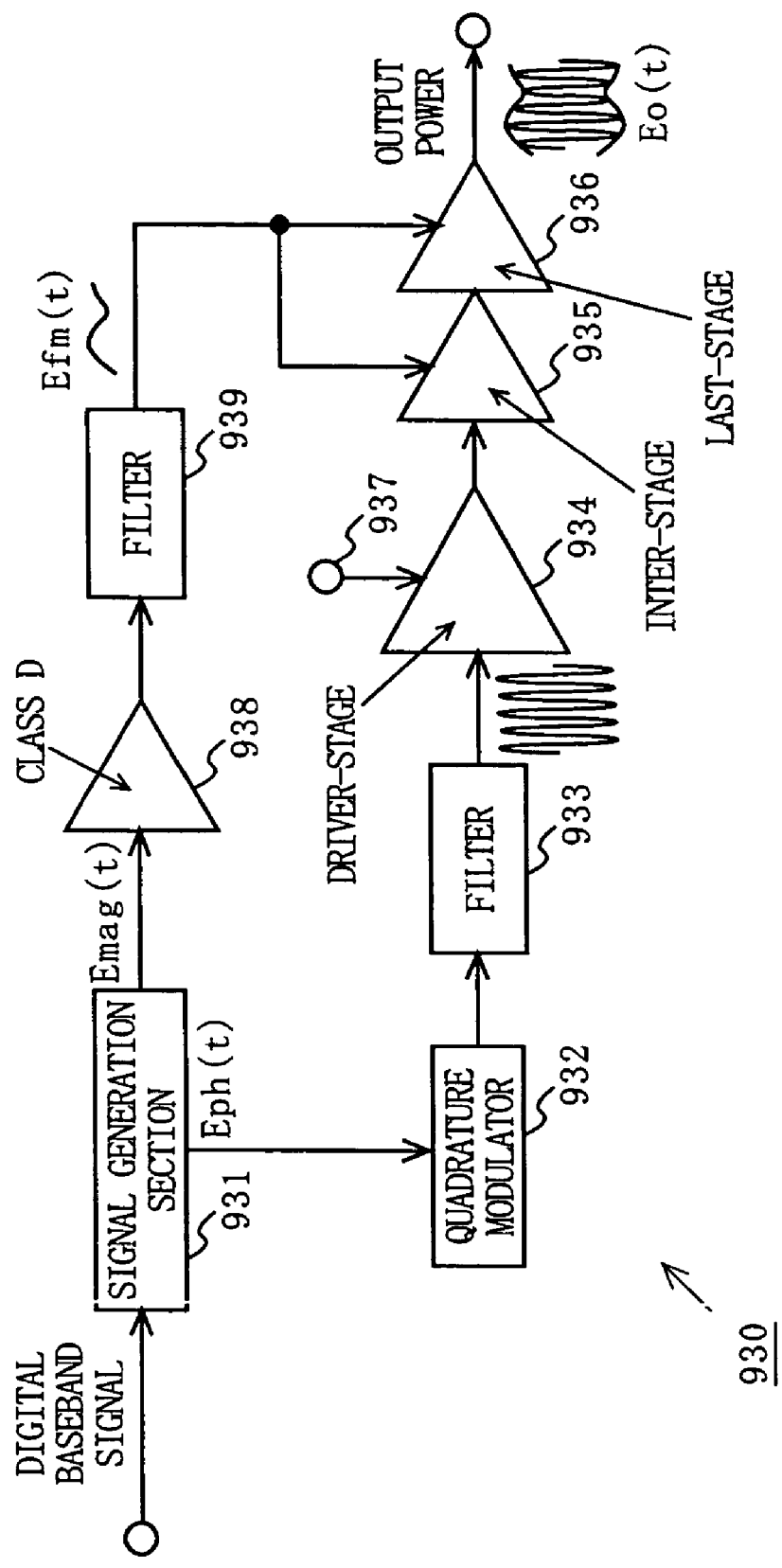
FIG. 11 is a diagram illustrating an exemplary structure of a transmitter 930 which performs a polar coordinate modulation (Polar Modulation) operation to substantially improve the operation efficiency of an amplifier.
Figure 12:
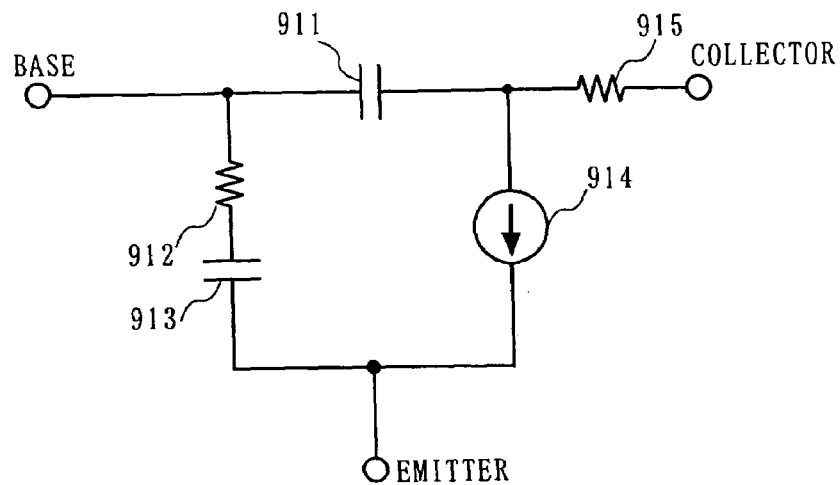
FIG. 12 is a schematic diagram illustrating an equivalent circuit of a transistor 910 shown in FIG. 10.
Figure 13:
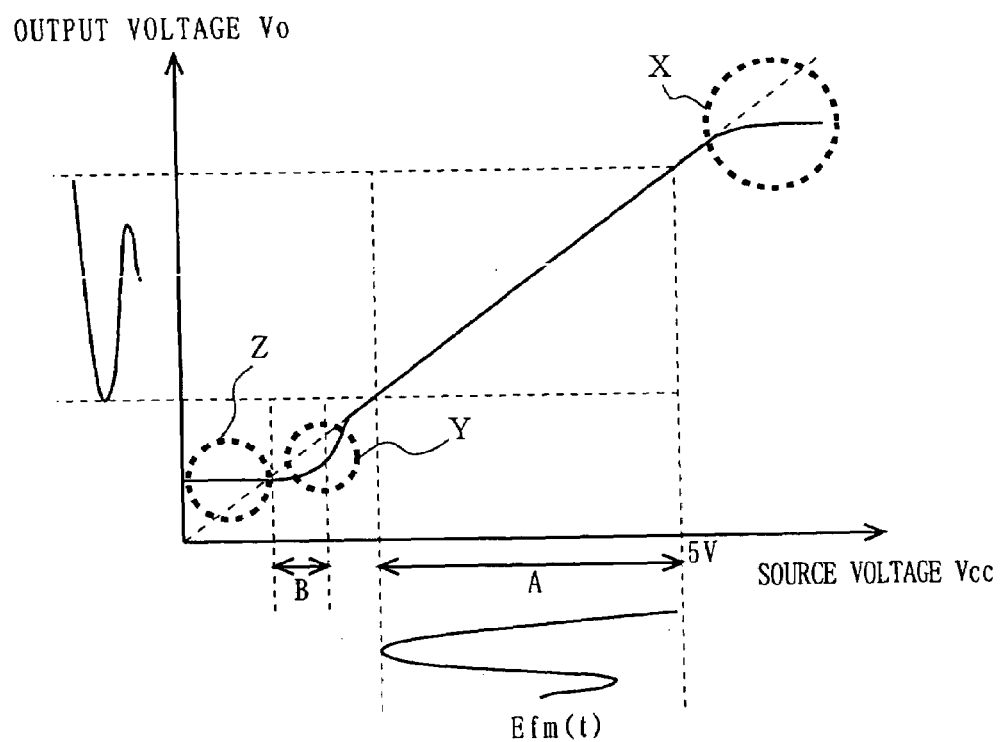
FIG. 13 is a graph illustrating the relationship between the source voltage Vcc and the output voltage Vo in a last-stage amplifier 936 shown in FIG. 11.

An example of a communication device to which an amplifier according to the present invention is applicable is a mobile phone. FIG. 9 is a front view showing a mobile phone to which an amplifier according to the present invention is applied. The amplifier according to the present invention may be used as an amplifier for a transmission signal. For example, the transmitter 500 shown in FIG. 7, incorporating such an amplifier, may be employed in the mobile phone. As a result, a communication device having a broad dynamic range, low distortion, and high efficiency can be realized.

An amplifier according to the present invention can provide a high gain, and therefore is useful as a transmission signal amplifier for a communication device or the like. Since a transmitter having a wide dynamic range, low distortion, and highly efficiency can be easily realized, the amplifier according to the present invention is useful for a transmitter in a wireless communication device or the like.

While the invention has been described in detail, the foregoing description is in all aspects illustrative and not restrictive. It is understood that numerous other modifications and variations can be devised without departing from the scope of the invention.

What is claimed is:

1. A power amplifier for amplifying a high-frequency signal and outputting an amplified signal, the power amplifier comprising:
   an amplification element which is a bipolar transistor or a field-effect transistor;
   a variable inductor connected between a base and a collector of the amplification element, or between a gate and a drain of the amplification element; and
   a control section for setting an inductance of the variable inductor in accordance with a change occurring in a voltage between the base and the collector of the amplification element, or between the gate and the drain of the amplification element, in a level of an amplitude modulation signal, or in a level of an envelope signal, wherein the inductance of the variable inductor is set by the control section so as to cause a parallel resonance to occur between the variable inductor, a parasitic capacitor of the amplification element, and an intrinsic capacitor of the amplification element, and wherein the intrinsic capacitor is a base-collector capacitance of the amplification element or a gate-drain capacitance of the amplification element.

2. The power amplifier according to claim 1, further comprising a resistor connected in series with the variable inductor.

3. The power amplifier according to claim 1, further comprising a capacitor connected in parallel with the variable inductor.

4. The power amplifier according to claim 1,
wherein the amplification element operates within a saturation region, and
wherein the inductance of the variable inductor is chosen so that a parallel resonance occurs with the parasitic capacitor and the intrinsic capacitor within the saturation region.

5. The power amplifier according to claim 1, wherein the amplification element outputs a modulated signal by mixing a phase modulated signal which is input to the base or the gate of the amplification element and an amplitude modulation signal which is input to the collector or the drain of the amplification element.

6. A communication device comprising an amplifier for amplifying a high-frequency signal for transmission, the amplifier for transmission including the power amplifier according to claim 1.

7. A transmitter for transmitting a high-frequency signal, the transmitter comprising:
a signal generation section for outputting a phase control signal based on a phase component of a baseband signal and outputting an amplitude modulation signal based on an amplitude component of the baseband signal;
a quadrature modulator for outputting a phase modulated signal by modulating a carrier signal in accordance with the phase control signal output from the signal generation section; and
a last-stage amplifier for, by using the amplitude modulation signal as a bias voltage, mixing the phase modulated signal with the amplitude modulation signal to output a transmission signal,
wherein the last-stage amplifier includes the power amplifier according to claim 1.

8. The transmitter according to claim 7, further comprising:
a driver-stage amplifier for amplifying the phase modulated signal output from the quadrature modulator; and
an inter-stage amplifier for amplifying the amplified phase modulated signal output from the driver-stage amplifier,
wherein, as the bias voltage, the amplitude modulation signal is input only to the last-stage amplifier, and
wherein the last-stage amplifier outputs, as the transmission signal, a mixture of the phase modulated signal output from the inter-stage amplifier and the amplitude modulation signal.

9. A power amplifier for amplifying a high-frequency signal and outputting an amplified signal, the power amplifier comprising:
an amplification element which is a bipolar transistor or a field-effect transistor;
a variable capacitor and an inductor connected in series or in parallel between a base and a collector of the amplification element, or between a gate and a drain of the amplification element; and
a control section for in setting a capacitance of the variable capacitor in accordance with a change occurring in a voltage between the base and the collector of the amplification element, or between the gate and the drain of the amplification element, in a level of an amplitude modulation signal, or in a level of an envelope signal,
wherein the capacitance of the variable capacitor is set by the control section so as to cause a parallel resonance to occur between the variable capacitor, a parasitic capacitor of the amplification element, and an intrinsic capacitor of the amplification element, and
wherein the intrinsic capacitor is a base-collector capacitance of the amplification element or a gate-drain capacitance of the amplification element.

10. The power amplifier according to claim 9,
wherein the amplification element operates within a saturation region, and
wherein the capacitance of the variable capacitor is chosen so that a parallel resonance occurs with the parasitic capacitor and the intrinsic capacitor within the saturation region.

11. The power amplifier according to claim 9, wherein the amplification element outputs a modulated signal by mixing a phase modulated signal which is input to the base or the gate of the amplification element and an amplitude modulation signal which is input to the collector or the drain of the amplification element.

12. A communication device comprising an amplifier for amplifying a high-frequency signal for transmission, the amplifier for transmission including the power amplifier according to claim 9.

13. A transmitter for transmitting a high-frequency signal, the transmitter comprising:
a signal generation section for outputting a phase control signal based on a phase component of a baseband signal and outputting an amplitude modulation signal based on an amplitude component of the baseband signal;
a quadrature modulator for outputting a phase modulated signal by modulating a carrier signal in accordance with the phase control signal output from the signal generation section; and
a last-stage amplifier for, by using the amplitude modulation signal as a bias voltage, mixing the phase modulated signal with the amplitude modulation signal to output a transmission signal,
wherein the last-stage amplifier includes the power amplifier according to claim 9.

14. A power amplifier for amplifying a high-frequency signal and outputting an amplified signal, the power amplifier comprising:
an amplification element which is a bipolar transistor or a field-effect transistor; and
a phase adjustment circuit including a variable inductor and at least one capacitor or inductor which is connected in series or in parallel with the variable inductor so that the capacitor or the inductor can be switched on or off, the phase adjustment circuit being connected between a base and a collector of the amplification element, or between a gate and a drain of the amplification element, wherein the phase adjustment circuit adjusts the variable inductor so that a phase difference between a leak signal and the amplified signal is π, the leak signal being a signal leaking via a circuit including:
  a parasitic capacitor of the amplification element;
  an intrinsic capacitor of the amplification element, the intrinsic capacitor being a base-collector capacitance or a gate-drain capacitance; and
  the phase adjustment circuit,
wherein the amplified signal is a signal that is output from the amplification element after amplification or attenuation thereby.

15. A communication device comprising an amplifier for amplifying a high-frequency signal for transmission, the amplifier for transmission including the power amplifier according to claim 14.

16. A transmitter for transmitting a high-frequency signal, the transmitter comprising:
  a signal generation section for outputting a phase control signal based on a phase component of a baseband signal and outputting an amplitude modulation signal based on an amplitude component of the baseband signal;
  a quadrature modulator for outputting a phase modulated signal by modulating a carrier signal in accordance with the phase control signal output from the signal generation section; and
  a last-stage amplifier for, by using the amplitude modulation signal as a bias voltage, mixing the phase modulated signal with the amplitude modulation signal to output a transmission signal,
  wherein the last-stage amplifier includes the power amplifier according to claim 14.

17. A power amplifier for amplifying a high-frequency signal and outputting an amplified signal, the power amplifier comprising:
  an amplification element which is a bipolar transistor or a field-effect transistor; and
  a phase adjustment circuit including a variable capacitor and at least one capacitor or inductor which is connected in series or in parallel with the variable capacitor so that the capacitor or the inductor can be switched on or off, the phase adjustment circuit being connected between a base and a collector of the amplification element, or between a gate and a drain of the amplification element,
wherein the phase adjustment circuit adjusts the variable capacitor so that a phase difference between a leak signal and the amplified signal is π, the leak signal being a signal leaking via a circuit including:
  a parasitic capacitor of the amplification element;
  an intrinsic capacitor of the amplification element, the intrinsic capacitor being a base-collector capacitance or a gate-drain capacitance; and
  the phase adjustment circuit,
wherein the amplified signal is a signal that is output from the amplification element after amplification or attenuation thereby.

18. A control method for a power amplifier for amplifying a high-frequency signal and outputting an amplified signal, the control method comprising:
  connecting a variable inductor or a variable capacitor between a base and a collector of an amplification element, or between a gate and a drain of the amplification element, wherein the amplification element is a bipolar transistor or a field-effect transistor included in the power amplifier;
  detecting a voltage between the base and the collector of the amplification element, or between the gate and the drain of the amplification element; and setting, in accordance with the detected voltage, an inductance of the variable inductor or a capacitance of the variable capacitor so as to cause a parallel resonance to occur between the variable inductor or the variable capacitor, a parasitic capacitor of the amplification element, and an intrinsic capacitor of the amplification element,
wherein the intrinsic capacitor being is a base-collector capacitance of the amplification element or a gate-drain capacitance of the amplification element.

* * * * *